(12) United States Patent
Peng et al.

(10) Patent No.: US 8,640,330 B2
(45) Date of Patent: Feb. 4, 2014

(54) EXTRACTING APPARATUS FOR STORAGE DEVICE MODULE

(75) Inventors: Wen-Tang Peng, Taipei Hsien (TW); Mo-Ming Yu, Shenzhen (CN); Lei Zheng, Shenzhen (CN); Xiang-Wei He, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 1104 days.

(21) Appl. No.: 12/608,948

(22) Filed: Oct. 29, 2009

(65) Prior Publication Data

US 2011/0042985 A1 Feb. 24, 2011

(30) Foreign Application Priority Data

Aug. 24, 2009 (CN) .......................... 2009 1 0305981

(51) Int. Cl.
*H05K 7/14* (2006.01)
(52) U.S. Cl.
USPC ................... 29/764; 361/679.33; 361/679.37; 361/679.38

(58) Field of Classification Search
CPC ............................ G06F 1/187; H05K 7/1411
USPC .............. 361/679.33, 679.37, 679.38; 29/764
See application file for complete search history.

(56) References Cited

U.S. PATENT DOCUMENTS

2007/0230105 A1* 10/2007 Su ................................. 361/685

FOREIGN PATENT DOCUMENTS

TW 560671 U1 * 11/2003

* cited by examiner

*Primary Examiner* — Livius R Cazan
(74) *Attorney, Agent, or Firm* — Altis Law Group, Inc.

(57) ABSTRACT

An extracting apparatus is disclosed. The extracting apparatus includes a mounting member, a handle pivotably connected to the mounting member, a latch member fixed to the mounting member and comprising a latch portion locked to the handle, and a release member slidably mounted to the mounting member and comprising an engaging portion for engaging with the latch member to deform the latch portion of the latch member, thereby releasing the latch portion from the handle.

18 Claims, 5 Drawing Sheets

EXTRACTING APPARATUS FOR STORAGE DEVICE MODULE

BACKGROUND

1. Technical Field

The present invention relates to extracting apparatuses and, more particularly, to an extracting apparatus for a data storage device module.

2. Description of Related Art

An electronic apparatus, such as a desktop computer, tower computer, server, or the like, usually includes storage devices, such as hard disk drives, compact disk read-only memory (CD-ROM) drives, digital video disc (DVD) drives, floppy disk drives, and the like. These devices are typically added to increase the functionality of the electronic apparatus as desired by a user.

The installation of a hard disk drive in a computer typically involves the use of screws to attach the hard disk drive to a bracket. Therefore, a storage device module including the hard disk drive and the bracket is formed, which is extractably mounted in a computer chassis. However, the storage device module is usually too tight in the computer chassis to be drawn out easily.

DETAILED DESCRIPTION

Figure 1:
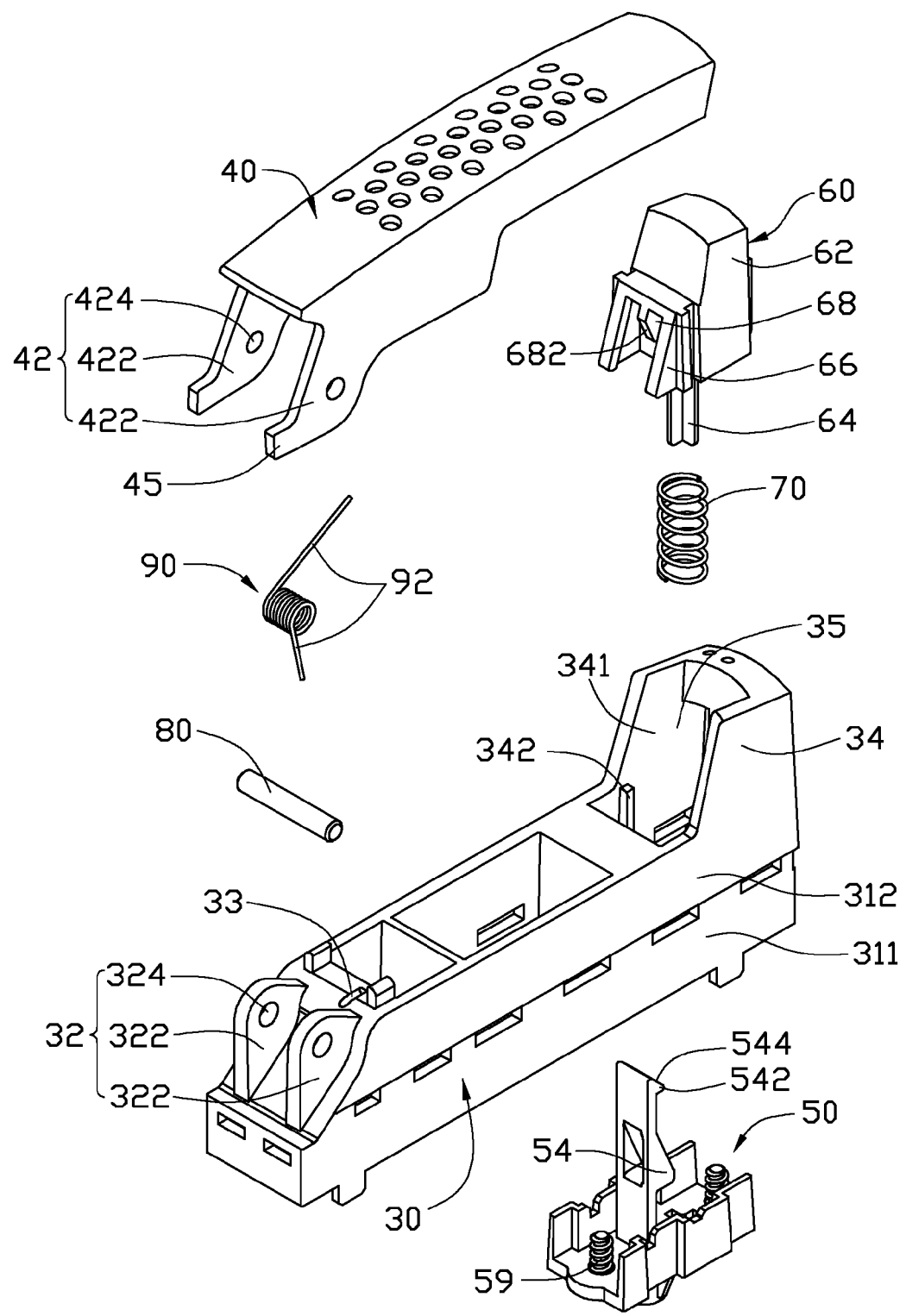
FIG. 1 is an exploded, isometric view of an exemplary embodiment of an extracting apparatus, the extracting apparatus including a mounting member.
Figure 2:
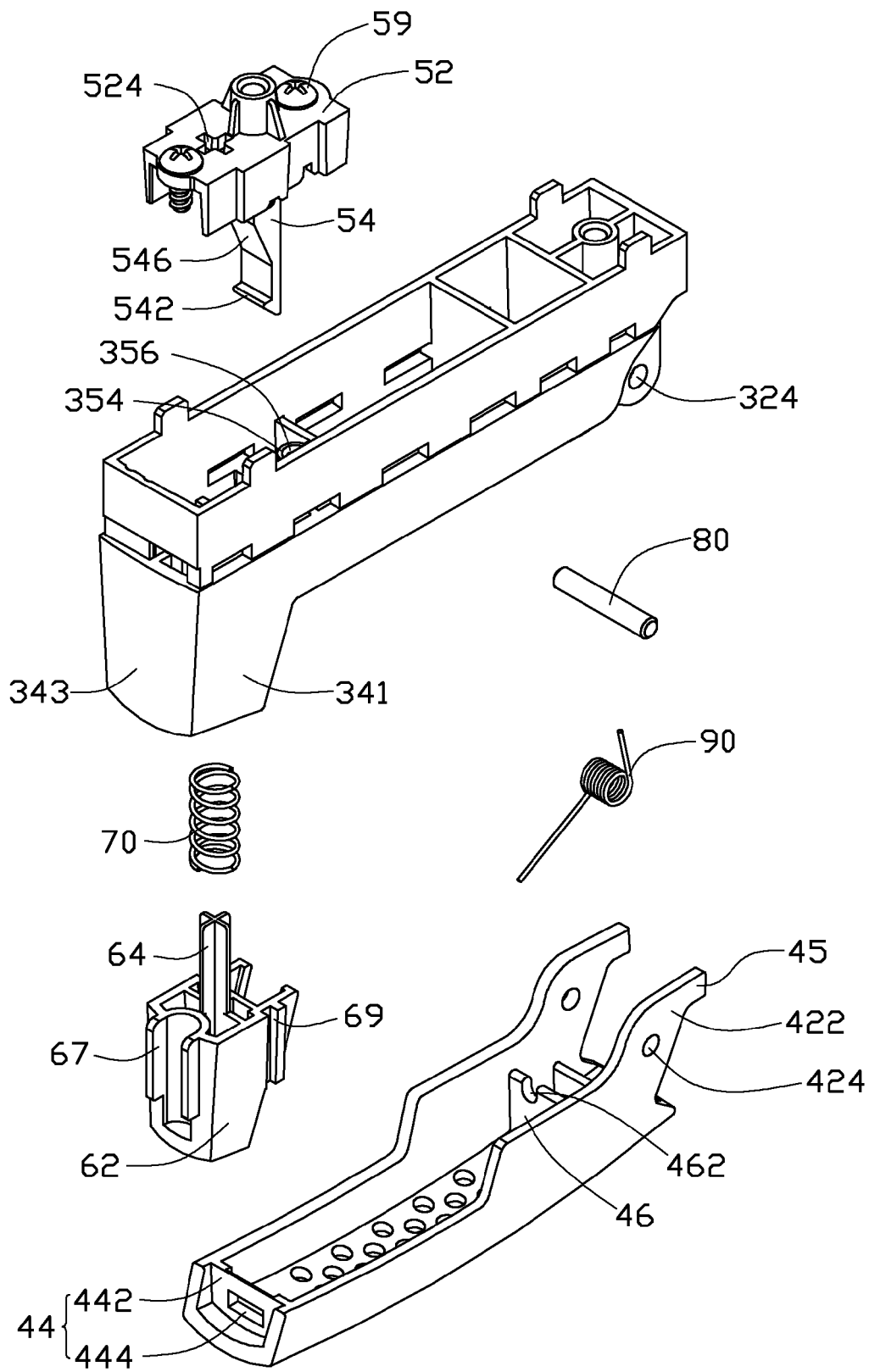
FIG. 2 is an inverted view of FIG. 1.

Referring to FIGS. 1 to 2, an exemplary embodiment of an extracting apparatus is provided to mount to a storage device module 100 (see FIG. 4), such as a hard disk drive module, to an electronic device, such as a computer. The extracting apparatus includes a mounting member 30, a handle 40, a latch member 50, a release member 60, a first resilient member 70, a pole 80, and a second resilient member 90. In this embodiment, the first resilient member 70 is a compression spring. The second resilient member 90 is a torsion spring, which includes two blocking ends 92.

Figure 3:
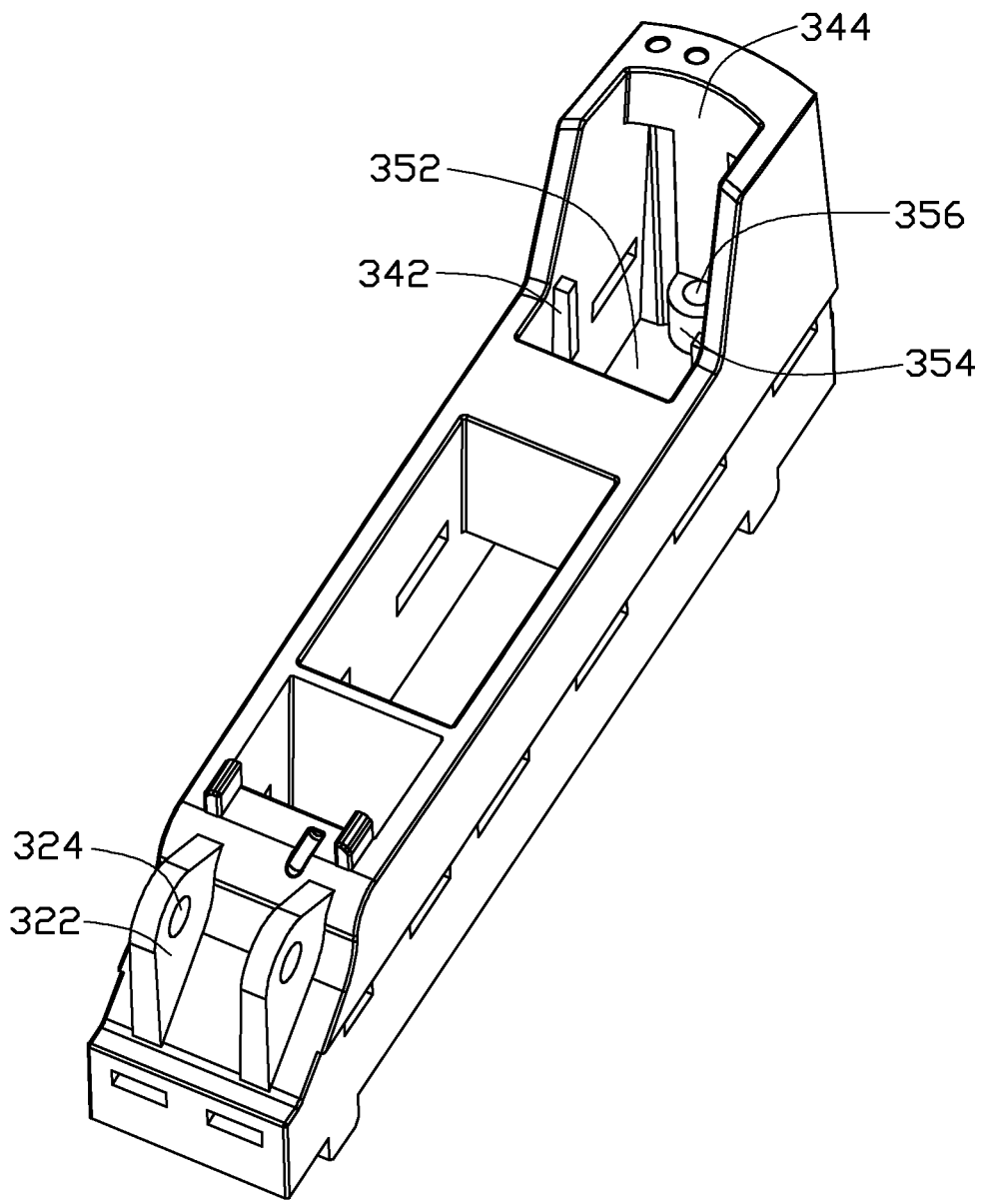
FIG. 3 is an enlarged view of the mounting member of FIG. 1, but viewed from another perspective.
Figure 4:
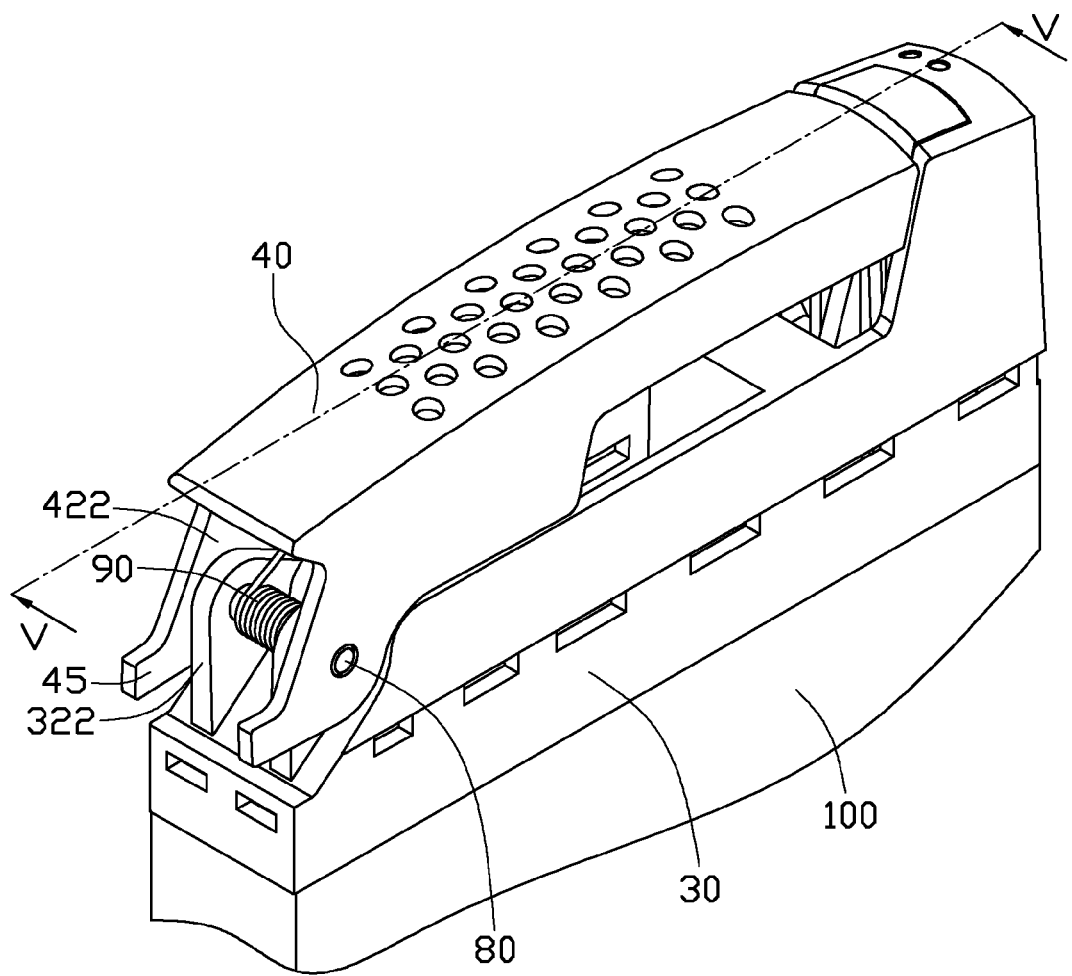
FIG. 4 is an assembled, isometric view of the extracting apparatus of FIG. 1.

Referring to FIG. 1, FIG. 3, and FIG. 4, the mounting member 30 includes a first side 311 for mounting the mounting member 30 to the storage device module 100. The mounting member 30 includes a pivot portion 32 and a U-shaped receiving portion 34 at a second side 312 opposite to the first side 311 of the mounting member 30. The pivot portion 32 includes two parallel pivot pieces 322. Each pivot piece 322 defines a pivot hole 324. A cutout 33 is defined in the mounting member 30, in the vicinity of the pivot portion 32. The receiving portion 34 defines a receiving space 35. Two slide rails 342 protrude from opposite first sidewalls 341 bounding the receiving space 35, respectively. Referring also to FIG. 2 and FIG. 3, a second sidewall 343 connected between the first sidewalls 341 to together bound the receiving portion 34 forms a limiting block 344 towards the receiving space 35. A through hole 352 is defined in a bottom of the receiving space 35. Two mounting columns 354 are arranged on the bottom of the receiving space 35, beside the through hole 352 and facing the storage device module 100. Each mounting column 354 defines a screw hole 356.

The handle 40 includes a connecting end 42 and a locking end 44 opposite to the connecting end 42. The connecting end 42 includes two parallel arms 422. Two through holes 424 are defined in the arms 422, respectively, and opposite to each other. Each arm 422 forms a locating portion 45 at a distal end of the arm 422. The locating portions 45 are engagable with a bracket (not shown in pictures) of the electronic device, to mount the storage device module 100 to the bracket. A ribbing 46 is formed between the arms 422. A cutout 462 is defined in the ribbing 46. The locking end 44 includes a locking plate 442 defining a locking hole 444 therein.

The latch member 50 includes a base 52 and a latch portion 54 extending from a middle of the base 52. The base 52 defines two mounting holes (not shown in pictures) at opposite sides the latch portion 54, for two screws 59 extending through, respectively. A cross-shaped positioning hole 524 is defined in the base 52, between the mounting holes of the base 52. The latch portion 54 includes a hook 542 formed at a distal end of the latch portion 54, and an inclined surface 546 formed at a middle of the latch portion 54. The hook 542 includes a guiding surface 544 at a distal end of the hook 542.

The release member 60 includes a main body 62 receivable in the receiving space 35 of the mounting member 30. A position pole 64 with a cross-shaped section extends from an end of the main body 62. Two parallel locating plates 66 extend from one side connected to the end of the main body 62. A distance between the locating plates 66 is set for the latch portion 54 of the latch member 50 extending through. An engaging portion 68 extends from the side of the main body 62, between the locating plates 66. The engaging portion 68 includes a slanting engaging surface 682. A sliding slot 69 is defined in an out surface of each locating plate 66. Two limiting plates 67 are formed from another side opposite to the locating plates 66 of the main body 62.

Figure 5:
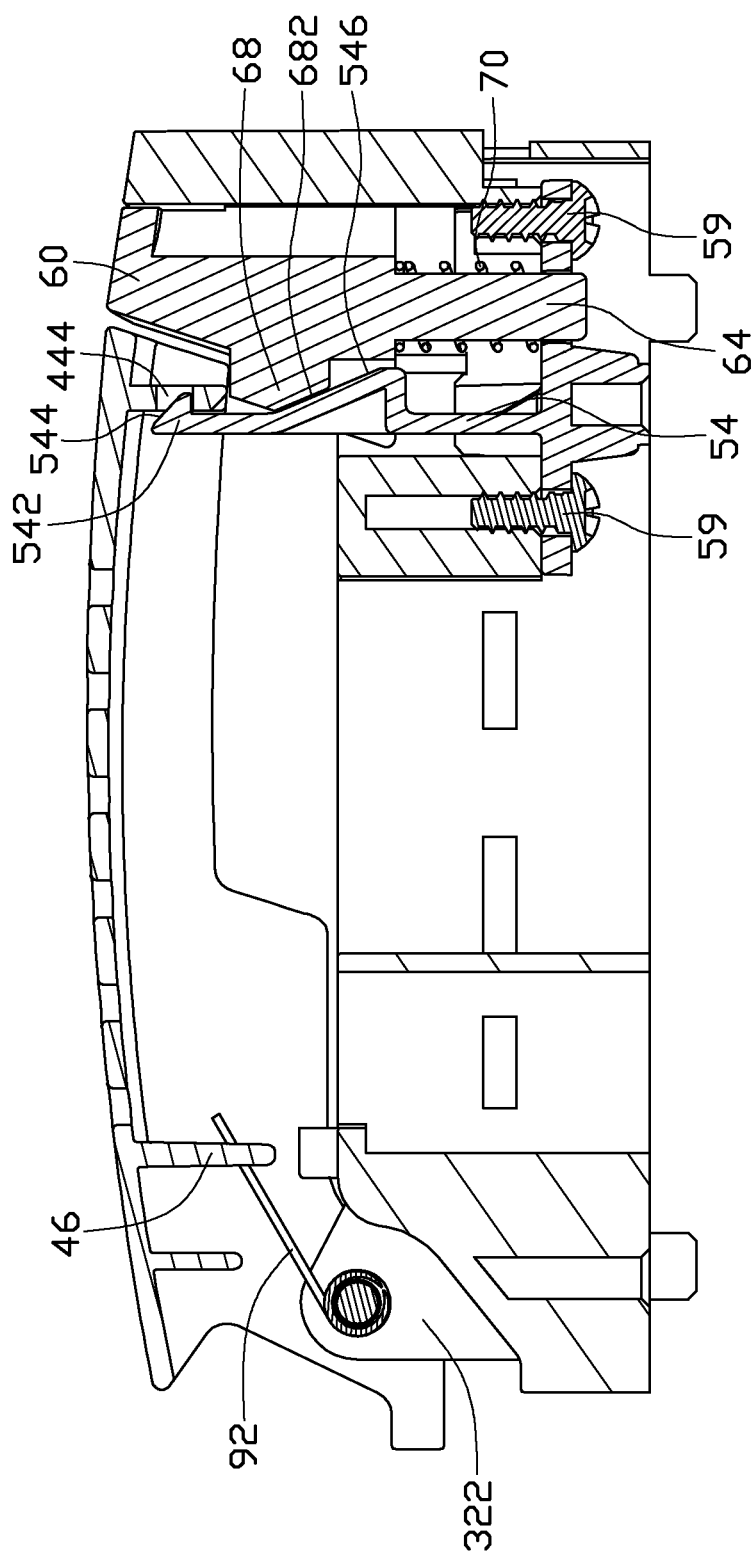
FIG. 5 is a cross-sectional view of FIG. 4, taken along the line of V-V of FIG. 4.

Referring to FIGS. 4 and 5, in assembly, the pole 80 extends through the through holes 424 of the handle 40 and the pivot holes 324 of the mounting member 30, to pivotably connect the handle 40 to the mounting member 30. The second resilient member 90 is set around the pole 80 and arranged between the pivot pieces 322 of the mounting member 30. One blocking end 92 is engaged in the cutout 33 of the mounting member 30, the other blocking end 92 is engaged in the cutout 462 of the handle 40.

The latch portion 54 of the latch member 50 extends through the through hole 352 of the mounting member 30, from the first side of the mounting member 30. The screws 59 are screwed into the screw holes 356, respectively, to fix the latch member 50 to the mounting member 30. The first resilient member 70 is set around the position pole 64 of the release member 60. The position pole 64 is inserted into the positioning hole 524 of the latch member 50, from the second side of the mounting member 30. Two ends of the first resilient member 70 resist against the base 52 of the latch member 50 and the end of the main body 62 of the release member 60. The slide rails 342 of the mounting member 30 are slidably engaged in the sliding slots 69 of the release member 60, respectively. The latch portion 54 of the latch member 50 extends between the locating plates 66 of the release member 60 to engage in the locking hole 444 of the handle 40, for locking the handle 40 to the mounting member 30.

To detach the storage device module 100 from the bracket, the release member 60 is pressed to compress the first resilient member 70. The engaging surface 682 of the release member 60 engages with the inclined surface 546 of the latch member 50 to deform the latch portion 54 away from the release member 60, for disengaging the hook 542 of the latch portion 54 from the locking hole 444 of the handle 40. The second resilient member 90 restores to rotate the handle 40, therefore, the locking end 44 of the handle 44 moves away from the mounting member 30, for users handing the handle 44 conveniently. Continue to rotate the handle 40 around the pole 80, the locating portions 45 of the handle 40 disengage from the bracket, thereby readily draw the storage device module 100 out from the bracket.

The guiding surface 544 of the latch portion 54 is used for guiding the hook 542 to engage in the locking hole 444 of the handle 40. The first resilient member 70 is used for restoring the release member 60. The limiting block 344 of the mounting member 30 is capable of engaging with the limiting plates 67, to avoid the release member 60 disengaging from the receiving portion 34 of the mounting member 30.

While several embodiments have been disclosed, it is understood that any element disclosed in any one embodiment is easily adapted to other embodiments. It is also to be understood, however, that even though numerous characteristics and advantages of the disclosure have been set forth in the foregoing description, together with details of the structure and function of the invention, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. An extracting apparatus, comprising:
a mounting member;
a handle comprising a connecting end pivotably connected to the mounting member and a locking end;
a latch member fixed to the mounting member and comprising a latch portion, the latch portion capable of engaging with the locking end of the handle;
a release member slidably attached to the mounting member to deform the latch portion of the latch member for releasing the latch portion from the locking end of the handle; and
a first resilient member connecting between the release member and the mounting member, for restoring the release member;
wherein the latch portion comprises a hook formed at a distal end of the latch portion and an inclined surface formed at a middle of the latch portion, the hook is engagable with the locking end of the handle, and the release member engages with the inclined surface to deform the latch portion.

2. The extracting apparatus of claim 1, further comprising a second resilient member arranged between the connected end of the handle and the mounting member, wherein the second resilient member is capable of biasing the locking end of the handle to move away from the mounting member, in response to the latch portion disengaging from the locking end of the handle.

3. The extracting apparatus of claim 1, wherein the locking end of the handle comprises a locking plate defining a locking hole, the hook of the latch portion comprising a guiding surface at a distal end of the hook, for guiding the hook to engage in the locking hole.

4. The extracting apparatus of claim 1, wherein the latch member defines a cross-shaped positioning hole and the release member forms a positioning pole with a cross-shaped section to slidably engage in the positioning hole.

5. The extracting apparatus of claim 4, wherein the first resilient member is set around the positioning pole, with a first end of the first resilient member engaging with the release member and a second end of the first resilient member engaging with the latch member.

6. The extracting apparatus of claim 1, wherein the mounting member comprises a pivot portion, to be pivotably connected to the connecting end of the handle, and a receiving portion, opposite to the pivot portion, to receive the release member.

7. The extracting apparatus of claim 6, wherein the release member forms two parallel locating plates, a sliding slot is defined in an outer surface of each locating plate, the receiving portion defines a receiving space to receive the release member, and two slide rails protrude from opposite sidewalls bounding the receiving space, for slidably engaging in the sliding slots of the locating plates, respectively.

8. The extracting apparatus of claim 1, wherein the release member forms two parallel locating plates, the latch portion of the latch member extending through the release member between the locating plates.

9. The extracting apparatus of claim 8, wherein an engaging portion extends from the release member between the locating plates, the engaging portion comprising an engaging surface for engaging with the latch portion, to drive the latch portion to deform.

10. An extracting apparatus, comprising:
a mounting member comprising a pivot portion and a receiving portion opposite to the pivot portion;
a handle pivotably connected to the pivot portion of the mounting member;
a latch member fixed to the mounting member and comprising a latch portion, the latch portion comprising a hook formed at a distal end of the latch portion and an inclined surface formed at a middle portion of the latch portion, wherein the hook is locked to the handle; and
a release member slidably received in the receiving portion of the mounting member and comprising an engaging portion for engaging with the inclined surface of the latch member to deform the latch portion of the latch member, thereby releasing the latch portion from the handle.

11. The extracting apparatus of claim 10, further comprising a resilient member arranged between the handle and the mounting member, to bias the handle to rotate.

12. The extracting apparatus of claim 10, further comprising a resilient member connected between the release member and the mounting member, to restore the release member.

13. The extracting apparatus of claim 12, wherein the latch member defines a cross-shaped positioning hole, the release member forms a positioning pole with a cross-shaped section slidably received in the positioning hole.

14. The extracting apparatus of claim 13, wherein the resilient member is set around the positioning pole, with a first end of the resilient member engaging with the release member and a second end of the first resilient member engaging with the latch member.

15. The extracting apparatus of claim 10, wherein the handle comprises a locking plate defining a locking hole, the hook of the latch portion comprising a guiding surface at a distal end of the hook, for guiding the hook to engage in the locking hole.

16. The extracting apparatus of claim 10, wherein the release member forms two parallel locating plates, a sliding slot is defined in an outer surface of each locating plate, the receiving portion defines a receiving space to receive the release member, and two slide rails protrude from opposite sidewalls bounding the receiving space, for slidably engaging in the sliding slots of the release member, respectively.

17. The extracting apparatus of claim 10, wherein the release member forms two parallel locating plates, the latch portion of the latch member extending through the release member between the locating plates.

18. The extracting apparatus of claim 17, wherein the engaging portion extends from the release member between the locating plates, the engaging portion comprising an engaging surface for pressing the inclined surface of the latch portion.

\* \* \* \* \*